(12) United States Patent
Rothberg et al.

(10) Patent No.: US 10,850,306 B2
(45) Date of Patent: Dec. 1, 2020

(54) CAPACITIVE MICROMACHINED ULTRASONIC TRANSDUCERS (CMUTS) AND RELATED APPARATUS AND METHODS

(71) Applicant: Butterfly Network, Inc., Guilford, CT (US)

(72) Inventors: Jonathan M. Rothberg, Guilford, CT (US); Keith G. Fife, Palo Alto, CA (US); Susan A. Alie, Stoneham, MA (US); Joseph Lutsky, Los Altos, CA (US); David Grosjean, Holliston, MA (US)

(73) Assignee: Butterfly Network, Inc., Guilford, CT (US)

( * ) Notice: Subject to any disclaimer, the term of this patent is extended or adjusted under 35 U.S.C. 154(b) by 118 days.

(21) Appl. No.: 15/905,289

(22) Filed: Feb. 26, 2018

(65) Prior Publication Data

US 2018/0243792 A1 Aug. 30, 2018

Related U.S. Application Data

(60) Provisional application No. 62/524,438, filed on Jun. 23, 2017, provisional application No. 62/464,346, filed on Feb. 27, 2017.

(51) Int. Cl.
*B06B 1/02* (2006.01)
*B81B 3/00* (2006.01)
(Continued)

(52) U.S. Cl.
CPC .......... *B06B 1/0292* (2013.01); *B81B 3/0086* (2013.01); *B81C 1/00698* (2013.01);
(Continued)

(58) Field of Classification Search
CPC .............. B06B 1/0292; G01N 29/2406; B81C 1/00698; B81C 2203/038; B81C 2201/0173; B81C 2201/115; B81B 3/0086
(Continued)

(56) References Cited

U.S. PATENT DOCUMENTS 5,470,797 A * 11/1995 Mastrangelo ......... G01L 9/0042
438/53
8,371,018 B2 * 2/2013 Chang ................... B06B 1/0292
29/594
(Continued)

OTHER PUBLICATIONS

International Search Report and Written Opinion dated May 15, 2018 in connection with International Application No. PCT/US2018/019697.
(Continued)

*Primary Examiner* — John K Kim
(74) *Attorney, Agent, or Firm* — Wolf, Greenfield & Sacks, P.C.

(57) ABSTRACT

Processes for fabricating capacitive micromachined ultrasonic transducers (CMUTs) are described, as are CMUTs of various doping configurations. An insulating layer separating conductive layers of a CMUT may be formed by forming the layer on a lightly doped epitaxial semiconductor layer. Dopants may be diffused from a semiconductor substrate into the epitaxial semiconductor layer, without diffusing into the insulating layer. CMUTs with different configurations of N-type and P-type doping are also described.

7 Claims, 9 Drawing Sheets

(51) Int. Cl.
   *B81C 1/00* (2006.01)
   *G01N 29/24* (2006.01)

(52) U.S. Cl.
   CPC .. *G01N 29/2406* (2013.01); *B81C 2201/0173* (2013.01); *B81C 2201/115* (2013.01); *B81C 2203/038* (2013.01)

(58) Field of Classification Search
   USPC ....................................................... 310/309
   See application file for complete search history.

(56) References Cited

U.S. PATENT DOCUMENTS

| | | | |
|---|---|---|---|
| 8,410,659 B2 * | 4/2013 | Chang | B06B 1/0292 310/309 |
| 9,067,779 B1 | 6/2015 | Rothberg et al. | |
| 9,132,693 B2 | 9/2015 | Klootwijk et al. | |
| 9,242,275 B2 | 1/2016 | Rothberg et al. | |
| 9,539,854 B2 | 1/2017 | Klootwijk et al. | |
| 2002/0055260 A1 * | 5/2002 | Chow | B81C 1/00246 438/689 |
| 2006/0004289 A1 * | 1/2006 | Tian | B06B 1/0292 600/459 |
| 2006/0019465 A1 * | 1/2006 | Guidry Cleavelin | H01L 21/26506 438/458 |
| 2006/0075818 A1 | 4/2006 | Huang et al. | |
| 2007/0164632 A1 | 7/2007 | Adachi et al. | |
| 2011/0095645 A1 * | 4/2011 | Chang | B06B 1/0292 310/300 |
| 2014/0239768 A1 * | 8/2014 | Johnson | B06B 1/0292 310/300 |
| 2017/0050217 A1 * | 2/2017 | Johnson | B06B 1/0292 |
| 2018/0243792 A1 * | 8/2018 | Rothberg | B06B 1/0292 |
| 2019/0133553 A1 * | 5/2019 | Belt | A61B 8/4281 |

OTHER PUBLICATIONS

International Preliminary Report on Patentability mailed Sep. 6, 2019 in connection with International Application No. PCT/US2018/019697.

* cited by examiner

CAPACITIVE MICROMACHINED ULTRASONIC TRANSDUCERS (CMUTS) AND RELATED APPARATUS AND METHODS

CROSS-REFERENCE TO RELATED APPLICATIONS

This application claims the benefit of U.S. Provisional Application Ser. No. 62/464,346, filed on Feb. 27, 2017 and entitled "METHOD AND SYSTEM FOR CAPACITANCE-VOLTAGE MEASUREMENT," which is hereby incorporated herein by reference in its entirety.

This application claims the benefit of U.S. Provisional Application Ser. No. 62/524,438, filed on Jun. 23, 2017 and entitled "CAPACITIVE MICROMACHINED ULTRASONIC TRANSDUCERS (CMUTs) AND RELATED APPARATUS AND METHODS," which is hereby incorporated herein by reference in its entirety.

BACKGROUND

Field

The present application relates to capacitive micromachined ultrasonic transducers (CMUTs) and related apparatus and methods.

Related Art

Capacitive micromachined ultrasonic transducers (CMUTs) are devices that include a membrane above a micromachined cavity. The membrane, cavity, and an opposing layer together form a capacitor. Moving the membrane alters the capacitance, such that motion of the membrane can be detected by monitoring the capacitance. Alternatively, the membrane can be forced to move by applying a voltage across the capacitor. Thus, the membrane may be used to transduce an acoustic signal into an electrical signal, or to transduce an electrical signal into an acoustic signal.

SUMMARY

Aspects of the present application provide capacitive micromachined ultrasonic transducers (CMUTs) including an oxide layer adjacent a cavity of a CMUT. The CMUT may be configured to reduce charge buildup within and/or leakage through the oxide layer. In one embodiment, there is provided a method for creating a high quality thermal oxidation layer in a capacitive micromachined ultrasonic transducer using an undoped oxide process, comprising utilizing a highly doped silicon wafer, growing an undoped epitaxial layer on the highly doped silicon wafer, growing an oxidation layer on the undoped epitaxial layer, and annealing the structure to disperse the doping into the undoped epitaxial layer.

According to an aspect of the application, a capacitive micromachined ultrasonic transducer (CMUT) is provided, comprising: a substrate, membrane, and dielectric layer disposed between the substrate and membrane, wherein the substrate and membrane are disposed with a cavity between them, and wherein one of the substrate and membrane is doped N-type and the other of the substrate and membrane is doped P-type.

According to an aspect of the application, a capacitive micromachined ultrasonic transducer (CMUT) is provided, comprising: a first doped semiconductor layer; a first electrode on the first doped semiconductor layer; a second doped semiconductor layer, wherein the first and second doped semiconductor layers are disposed with a cavity between them such that the first doped semiconductor layer forms a membrane over the cavity; a second electrode on the second doped semiconductor layer; and an oxide layer between the first and second doped semiconductor layers.

According to an aspect of the application, a method of forming a capacitive micromachined ultrasonic transducer (CMUT) is provided, comprising: forming a first substrate by: depositing a layer of epitaxial silicon on a doped silicon layer; forming a layer of silicon dioxide on the layer of epitaxial silicon; and diffusing dopants from the doped silicon layer into the layer of epitaxial silicon by performing an anneal. The method further comprises bonding the first substrate with a second substrate such that the silicon dioxide contacts the second substrate.

According to an aspect of the application, a capacitive micromachined ultrasonic transducer (CMUT) is provided, comprising: a first silicon layer; an epitaxial silicon layer disposed on the first silicon layer; a second silicon layer separated from the epitaxial layer by a cavity; and a dielectric layer disposed between the epitaxial layer and the second silicon layer.

According to an aspect of the application a capacitive micromachined ultrasonic transducer (CMUT) is provided, comprising: a substrate, a membrane, and a first and second dielectric layer disposed between the substrate and membrane. The first dielectric layer is located on an underside of the membrane. The second dielectric layer is located on the substrate opposed the first dielectric layer. The substrate and membrane are further disposed with a cavity between them. At least one of the first or second dielectric layers is a patterned layer with a non-uniform surface, and one of the substrate or membrane is doped N-type and the other of the substrate and membrane is doped P-type.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Aspects of the technology described herein relate to microfabricated ultrasonic transducers, such as CMUTs, having a dielectric layer disposed adjacent a transducing gap of the ultrasonic transducer. The transducers may be fabricated and configured such that the dielectric layer does not undesirably store charge or conduct leakage current when the transducer is in operation. In some embodiments, the transducer may be operated in collapse mode, such that the transducer membrane contacts an opposing layer. Despite the contact, the dielectric layer may prevent leakage current flow and/or undesirable charge buildup. As a result, the collapse mode voltage may remain relatively constant during operation. In some embodiments, dielectric layers may be present on both the transducer membrane and the opposing layer. For example, high quality thermal oxide may be disposed on at least one of them, and in some embodiments both. During collapse mode operation, only the dielectric layers may come into contact with each other in some embodiments.

The inventors have appreciated that CMUTs having an oxide layer between the CMUT membrane and the CMUT substrate may exhibit a varying collapse mode voltage. That is, the voltage needed to induce membrane collapse may vary during operation of the CMUT, owing to the characteristics of the oxide layer. Thus, it may be difficult to predictably operate such a CMUT in collapse mode, which may be undesirable in situations in which collapse mode operation is desired.

Accordingly, a first aspect of the present application provides a method of fabricating an ultrasonic transducer having a doped substrate and a high quality thermal oxide. The inventors have appreciated that when an oxide layer is grown on a highly doped silicon layer, "auto-doping" may occur, where some dopants from the highly doped silicon layer are incorporated into the oxide. Such auto-doping may be undesirable, and may contribute to varying collapse mode voltage. The fabrication process according to an aspect of the present application may involve growing an undoped epitaxial silicon layer on a doped silicon layer (e.g., a substrate). An oxide layer, or other dielectric, may then be formed on the undoped epitaxial silicon layer. The structure may be annealed to diffuse the dopants from the doped silicon substrate into the undoped epitaxial silicon, without diffusing dopants into the oxide layer. In this manner, auto-doping of the oxide layer with dopants from the doped silicon layer may be avoided. The structure may then be bonded with another substrate to form a sealed ultrasonic transducer cavity. Forming the ultrasonic transducer in this manner may ensure the oxide layer is relatively free of dopants. As the oxide layer is grown on the undoped epitaxial silicon layer, no dopants are unintentionally introduced into the oxide layer. This in turn may ensure the oxide layer exhibits desirable insulating behavior, such as preventing leakage current and/or charge build-up in the oxide layer. While silicon and silicon oxide are described as examples of suitable materials, other materials (e.g., other semiconductors and dielectrics) may be used.

According to another aspect of the present application, a method of fabricating an ultrasonic transducer is provided, the ultrasonic transducer having two opposing doped substrates or layers separated by a cavity with a thermal oxide or other dielectric between them. One of the substrates may form a membrane, configured to vibrate. In one embodiment, the doped substrate has P-type doping and the doped membrane has N-type doping. In another embodiment, the doped substrate and the doped membrane have P-type doping. In another embodiment, the doped substrate and the doped membrane have N-type doping. In another embodiment, the doped substrate has N-type doping and the doped membrane has P-type doping. Methods for fabricating such devices are disclosed.

According to another aspect of the present application, a method of fabricating an ultrasonic transducer having a doped substrate, a doped membrane, and two dielectric layers disposed between the doped substrate and the doped membrane is provided. The doped substrate and doped membrane may be disposed with a cavity between them. The fabrication process may involve patterning at least one of the dielectric layers to have a non-uniform surface. In one embodiment, the upper dielectric layer, disposed on the underside of the doped membrane, may be patterned. In another embodiment, the lower dielectric layer, disposed on the doped substrate opposed the upper dielectric layer, may be patterned. In another embodiment, both the upper and lower dielectric layers may be patterned.

The various fabrication techniques described herein may be performed at a wafer level or die level. In at least some embodiments, wafer level processing may provide manufacturing efficiency gains, and thus may be employed. The processing techniques for MEMS may be compatible for integration with metal oxide semiconductor (MOS) devices in some embodiments, and may also be compatible with analog circuitry, digital circuitry, interposers, and wafer-level packaging techniques, including fan-in and fan-out wafer-level packaging.

The aspects and embodiments described above, as well as additional aspects and embodiments, are described further below. These aspects and/or embodiments may be used individually, all together, or in any combination of two or more, as the application is not limited in this respect.

Figure 1:
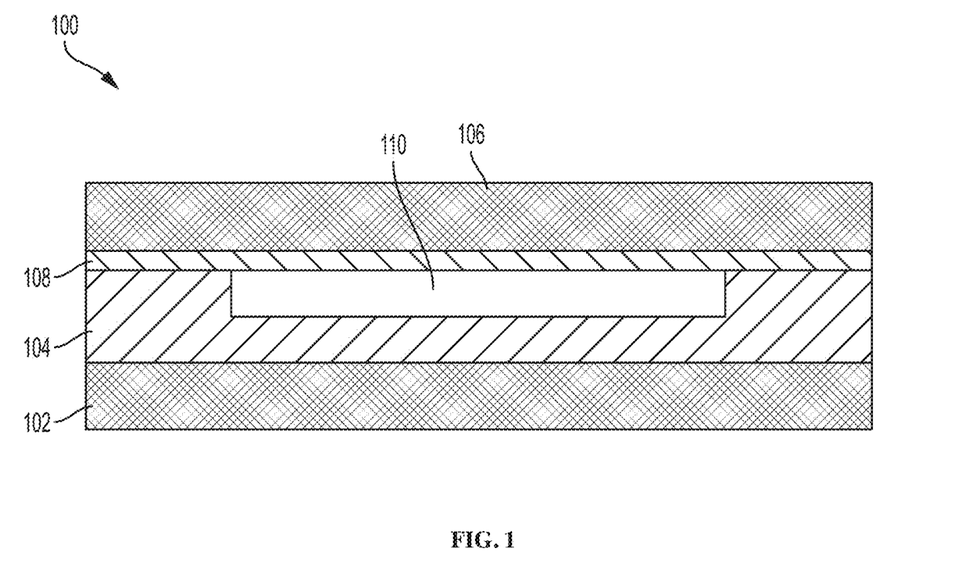
FIG. 1 illustrates a cross-sectional view of an ultrasonic transducer, according to a non-limiting embodiment of the present application.

FIG. 1 illustrates a cross-sectional view of an ultrasonic transducer according to an embodiment of the present application. The ultrasonic transducer 100 includes a substrate 102, dielectric layer 104, membrane 106, and dielectric layer 108. The dielectric layers 104 and 108 may be silicon oxide in at least some embodiments, although alternatives are possible. As shown, the dielectric layer 104 may have a cavity 110 formed therein.

It should be appreciated that alternative ultrasonic transducer configurations to that shown in FIG. 1 may be employed. For example, in alternative embodiments, the cavity 110 may be formed in the dielectric layer 108. In other embodiments, the cavity 110 may be formed in the substrate 102 or the membrane 106, with the dielectric layer 104 or 108 lining the inside of the cavity. The membrane 106 and dielectric layer 108 may seal the cavity 110. In some embodiments, only one of dielectric layers 104 and 108 is provided. Still further arrangements are possible.

Figure 2A:
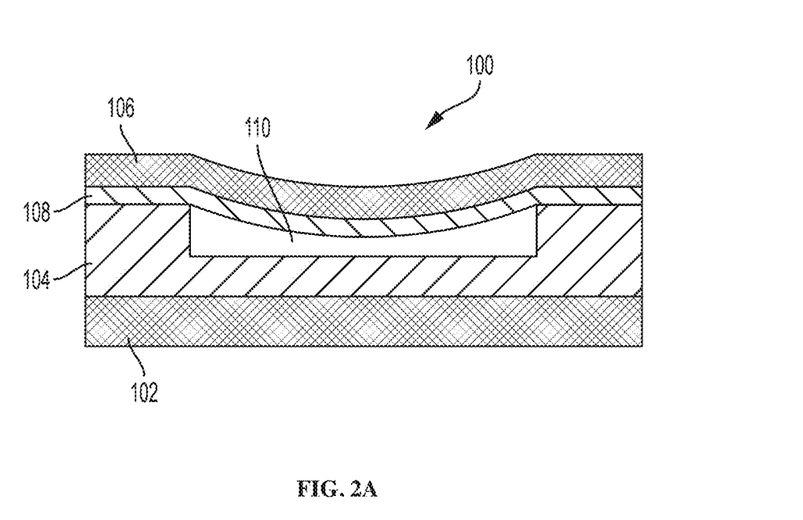
FIG. 2A illustrates operation of the ultrasonic transducer of FIG. 1 when the transducer membrane does not contact the opposing surface.
Figure 2B:
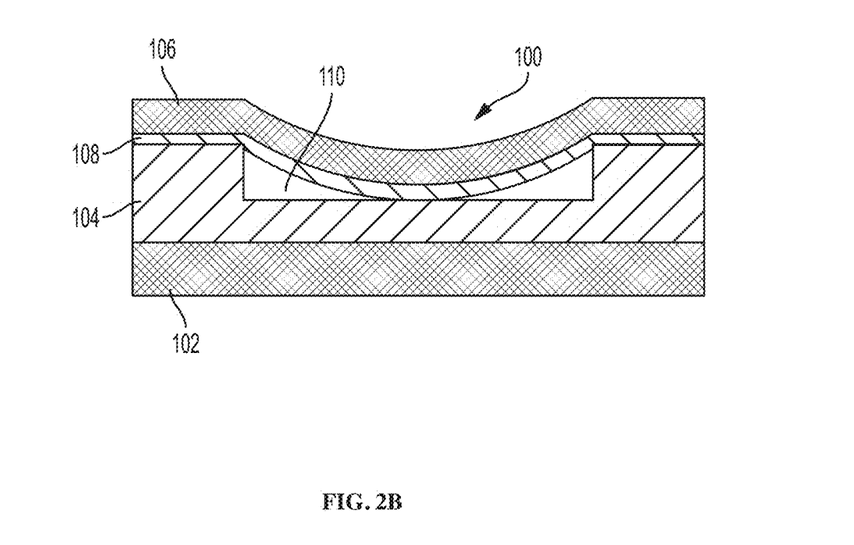
FIG. 2B illustrates operation of the ultrasonic transducer of FIG. 1 in collapse mode, when the transducer membrane contacts the opposing surface.

FIGS. 2A and 2B illustrate two operational states of the ultrasonic transducer 100 of FIG. 1. FIG. 2A represents operation of the ultrasonic transducer 100 when the membrane 106 and dielectric layer 108 do not contact the bottom boundary of the cavity 110. FIG. 2B illustrates collapse mode operation, in which the membrane 106 and dielectric layer 108 are deflected sufficiently far to contact the bottom surface of the cavity 110. During such contact, there is the chance for leakage current to flow through the dielectric layers 104 and 108 and/or to induce charge buildup in the dielectric layers.

According to an aspect of the present application, the ultrasonic transducer is constructed such that the dielectric layer 104 and/or dielectric layer 108 does not store significant charge or allow the flow of leakage current, even when the transducer is operated in collapse mode. According to an embodiment of the present application, the ultrasonic transducer is formed with a doped substrate, for example membrane 106, on which epitaxial silicon is grown. The dielectric layer 108 is then formed (e.g., grown or otherwise deposited) on the epitaxial silicon. An anneal is performed to diffuse dopants from the doped portion of the substrate into the epitaxial layer. However, the dopants do not diffuse into the dielectric layer 108. Thus, the dielectric layer 108 may remain substantially free of dopants. As a result, the dielectric layer 108 may exhibit desirable insulating properties, and the collapse mode voltage of the ultrasonic transducer may remain substantially constant during operation.

An example of the fabrication of the ultrasonic transducer 100 is now described with respect to FIGS. 3A-3F.

Figure 3A:
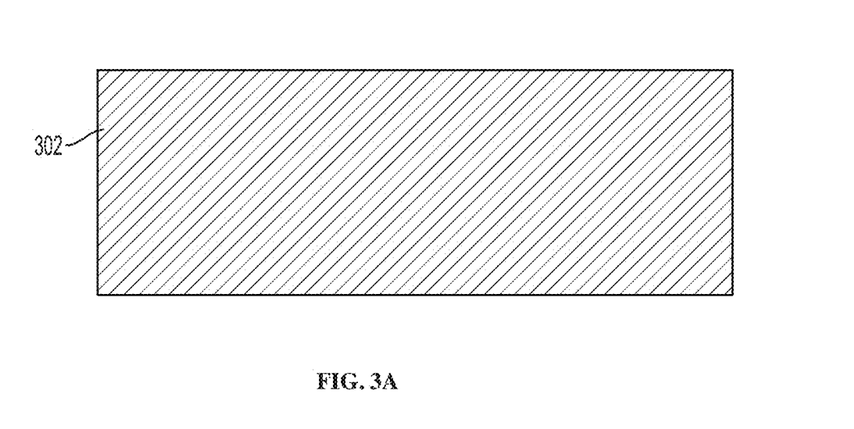
FIGS. 3A-3H illustrate an exemplary sequence for forming an oxidation layer on a silicon substrate of a micromachined ultrasonic transducer.

FIG. 3A illustrates a first stage of the fabrication of the ultrasonic transducer, starting with a doped substrate 302. The doped substrate 302 may be used to form the membrane 106 of FIG. 1. A silicon-on-insulator (SOI) wafer may be used, with 302 representing the silicon device layer. In an alternative embodiment, the doped substrate 302 may be a bulk doped wafer, such as a silicon wafer or other semiconductor material. Other materials are also possible. The doping of the substrate 302 may be P-type or N-type, and may be of a level sufficient to make the substrate conductive. The substrate 302 may be used as a top or bottom electrode of the ultrasonic transducer in some embodiments, and thus conductive behavior may be desirable. In some embodiments, the substrate 302 is doped to a level between $10^{15}$ and $10^{21}$ dopants/cm$^3$.

Figure 3B:
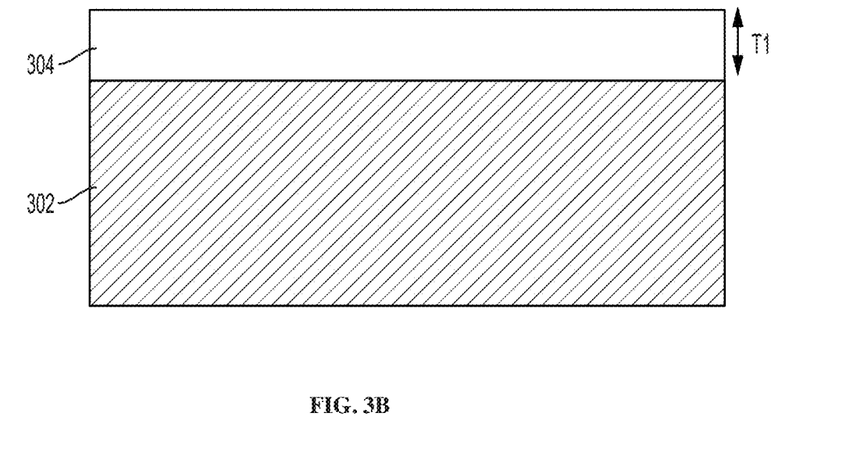

FIG. 3B illustrates a second stage of the fabrication of the ultrasonic transducer. At this stage, a substantially undoped epitaxial layer 304 may be formed (e.g., grown) on the doped substrate 302. The epitaxial layer may be composed of the same material as the substrate on which it is grown, for example silicon. Alternatively, the epitaxial layer may be composed of a material different from the substrate on which it is grown. Thus, either homoepitaxy or heteroepitaxy may be performed. Also, substrates having an epitaxial layer on them may be obtained commercially and serve as the starting point for further fabrication.

As described, the epitaxial layer 304 may be substantially undoped at the stage of FIG. 3B, for example being lightly doped. In some non-limiting embodiments, the epitaxial layer 304 may have a dopant concentration on the order of $10^{15}$ dopants/cm$^3$. Substrate 302 and epitaxial layer 304 are shown with different fill patterns to represent the different doping levels even though, as previously described, they may be formed of the same material (e.g., silicon).

The epitaxial layer 304 may have a suitable thickness to inhibit diffusion of dopants from the substrate 302 into a subsequently formed dielectric layer, described further below. For example, the epitaxial layer 304 may have a thickness T1 between 1 micron and 10 microns, including any value within that range.

Figure 3C:
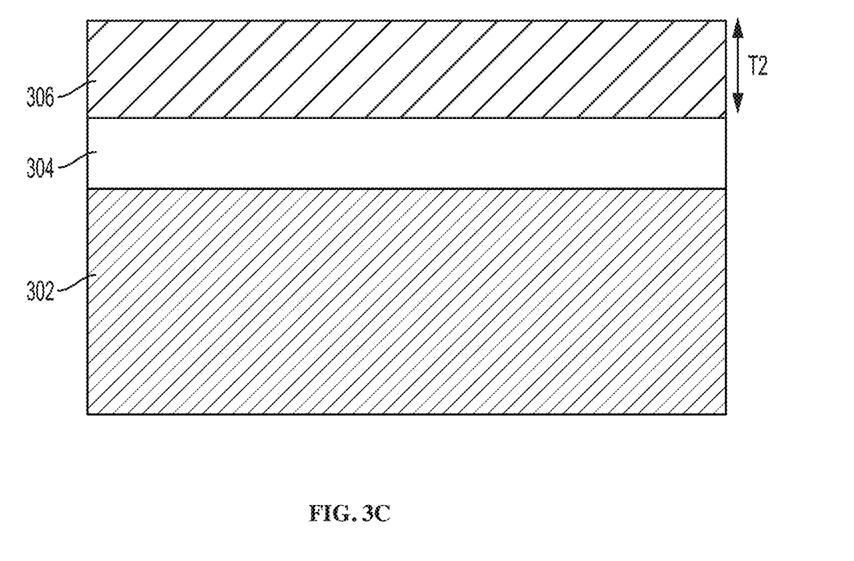

FIG. 3C illustrates a third stage of the fabrication of the ultrasonic transducer. At this stage, an oxide layer 306 may be formed (e.g., grown or otherwise deposited) on the substantially undoped epitaxial layer 304. The oxide layer 306 may be the dielectric layer 108 of FIG. 1. By providing an undoped layer of silicon for the oxide to grow on, the oxide layer 306 may itself may not incorporate dopants from the underlying silicon. For example, the oxide layer 306 may have $10^{15}$ dopants/cm$^3$ or less. In this manner, the oxide layer 306 may operate substantially as an insulator, and thus inhibit the flow of leakage current when the ultrasonic transducer operates in collapse mode. While silicon oxide represents one example of a dielectric material, other materials may alternatively be used for layer 306.

The oxide layer 306 may have any suitable thickness T2. In some embodiments, the thickness T2 is between 0.1 microns and 1 microns (e.g., 0.3 microns), including any value within that range, or may be as thin as a few hundred angstroms. The thickness may be selected to provide a desired level of protection against electrical breakdown when the ultrasonic transducer is operated in collapse mode, and thus may be selected in dependence on an expected operating voltage of the ultrasonic transducer.

Figure 3D:
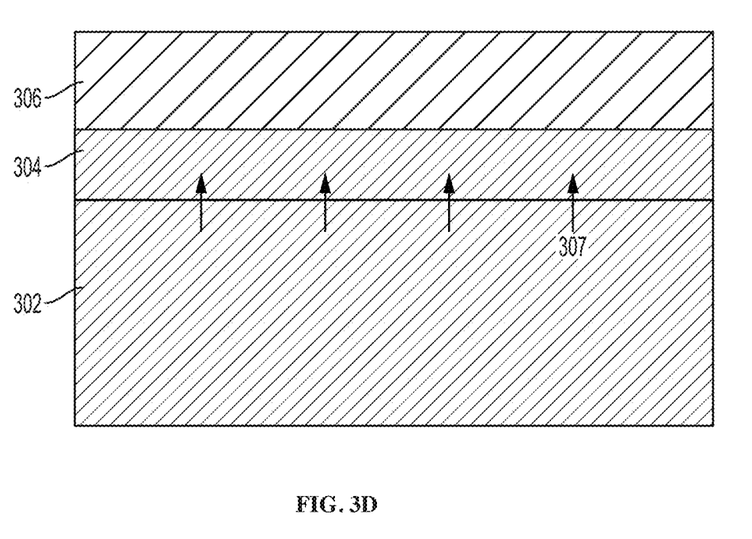

FIG. 3D illustrates a fourth stage of the fabrication of the ultrasonic transducer. At this stage, an anneal may be performed. As a result, the doping in the doped substrate 302 may diffuse into the epitaxial layer 304 as indicated by the upward arrows 307 and the epitaxial layer 304 now being shown with the same fill pattern as the substrate 302. In doing so, the epitaxial layer 304 may be doped sufficiently to be conductive up to the boundary with the high quality thermal oxide layer 306. For example, the epitaxial layer 304 may, at this stage, having a doping substantially equal to the doping of the substrate 302, and thus may have any value previously described with respect to substrate 302. In practice, depending on the thickness of the substrate 302 at the stage of FIG. 3D, the doping concentration of substrate 302 and epitaxial layer 304 may diminish along a direction moving away from the interface between epitaxial layer 304 and oxide layer 306.

While the dopants from the substrate 302 are controlled (e.g., via anneal) to diffuse into the epitaxial layer 304, the process and thermal budget are optimized to prevent incorporation or diffusion of dopants across the boundary (or interface) between layer 304 and layer 306. Thus, the oxide layer 306 may remain substantially free of dopants.

Figure 3E:
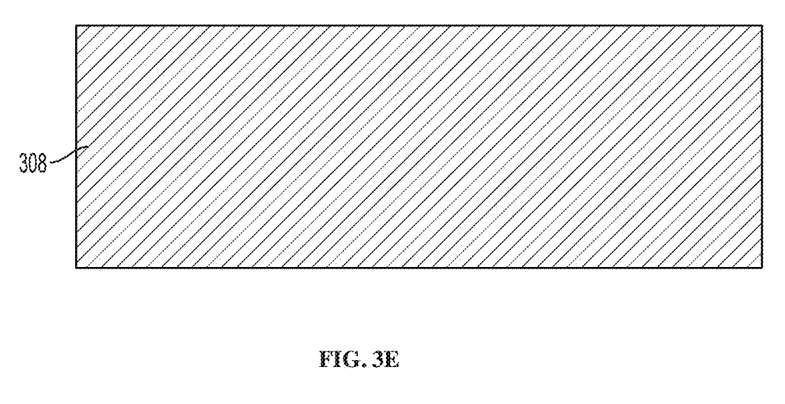

FIG. 3E illustrates a fifth stage of the fabrication of the ultrasonic transducer. At this step, a doped substrate 308 may be provided. The doped substrate 308 may correspond to the substrate 102 of FIG. 1. The doped substrate 308 may be a bulk doped wafer, such as a silicon wafer or other semiconductor material. Other materials are also possible. Also, rather than a bulk wafer, a silicon-on-insulator (SOI) wafer may be used, with 308 representing the silicon device layer. The doping of the substrate 308 may be P-type or N-type, and may be of a level sufficient to make the substrate conductive. The substrate 308 may be used as a top or bottom electrode of the ultrasonic transducer in some embodiments, and thus conductive behavior may be desirable. In some embodiments, the substrate 308 is doped to a level between $10^{15}$ and $10^{21}$ dopants/cm$^3$.

Figure 3F:
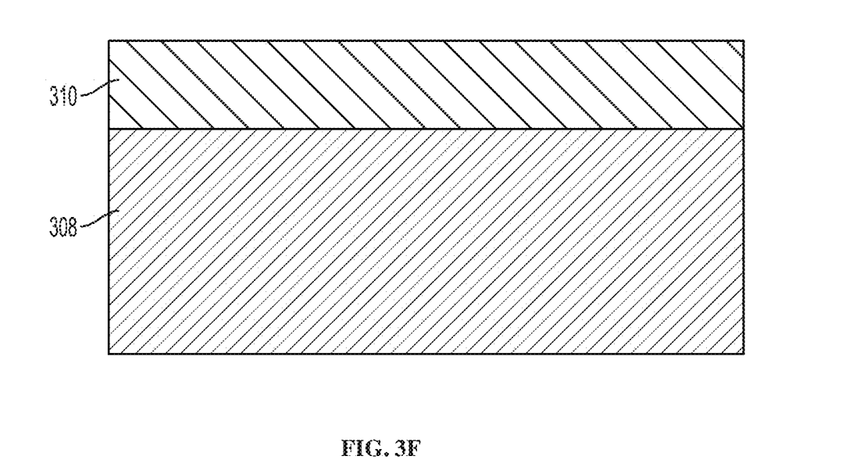

FIG. 3F illustrates a sixth stage of the fabrication of the ultrasonic transducer. At this step, an oxide layer 310 may be formed (e.g., grown or otherwise deposited) on the substrate 308. The oxide layer may correspond to the dielectric layer 104 of FIG. 1. The oxide layer 310 may be substantially less doped than the substrate 308 on which it is formed. Any doping in the oxide layer may be the result of the growth process on the doped substrate 308.

Figure 3G:
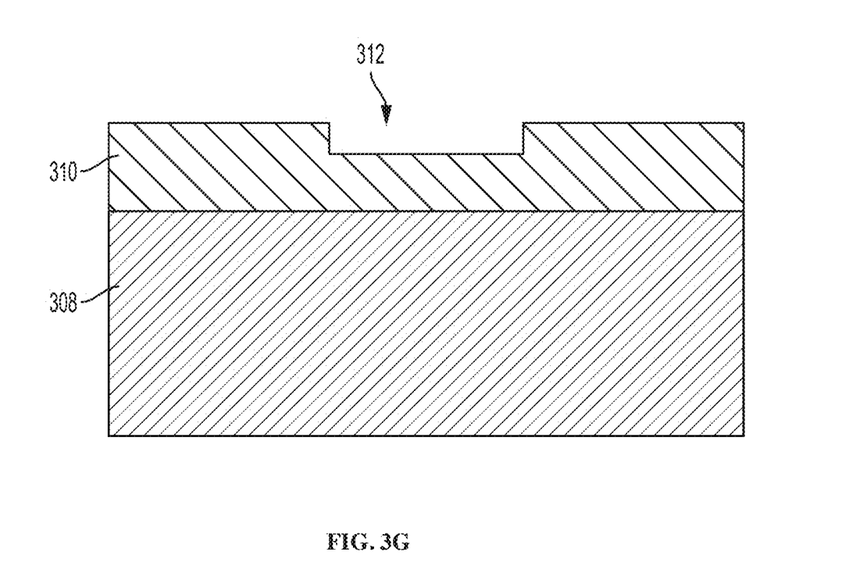

FIG. 3G illustrates a seventh stage of the fabrication of the ultrasonic transducer according to a non-limiting embodiment. At this step, a cavity 312 may be etched into the oxide layer 310. The cavity 312 may correspond to the cavity 110 of FIG. 1. In the non-limiting embodiment illustrated, the cavity is formed by partially etching the oxide layer 310, for example with a timed etch. However, alternative embodiments use a complete etch of the oxide layer 310, such that the resulting cavity is formed through the complete thickness of the oxide layer 310. Such may involve use of an etch stop, such as the doped substrate 308. The cavity may have any suitable dimensions to provide desirable transduction characteristics of the resulting ultrasonic transducer. For example, the cavity depth may be between 1,500 Angstroms and 3,500 Angstroms, as a non-limiting example.

Figure 3H:
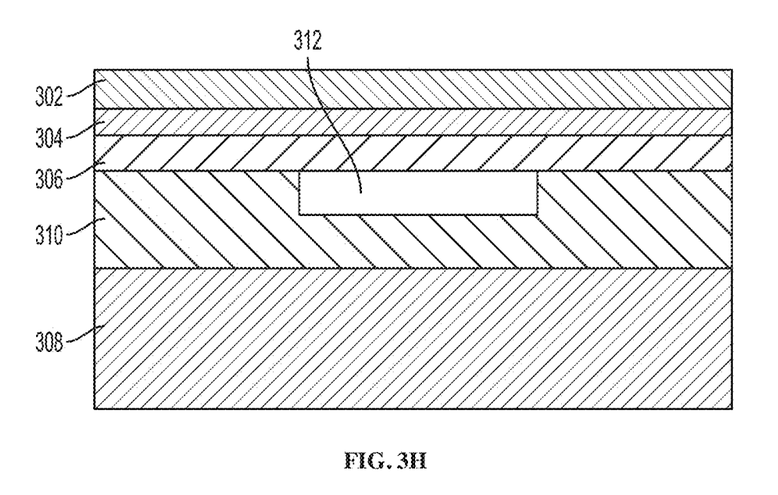

FIG. 3H illustrates an eighth stage of the fabrication of the ultrasonic transducer. At this stage, the substrate 302, epitaxial layer 304, and the oxide layer 306 may be bonded with the substrate 308 and oxide layer 310 such that the oxide layers 306 and 310 face each other. Thus, an oxide-oxide bond may be formed, although alternatives are possible. The fabrication may optionally include an annealing step to form a strong bond. The bond may be performed in a vacuum in at least some embodiments such that the cavity is vacuum sealed.

The substrate 302 may optionally be thinned to form a membrane sufficient for operation in an ultrasonic transducer. For example, grinding, etching, or other thinning techniques may be employed. If the substrate 302 represents the device layer of an SOI wafer, the handle layer and optionally the buried oxide layer (not shown) may be removed. The resulting membrane comprising substrate 302—or the remaining portion of substrate 302—and epitaxial layer 304 with oxide layer 306 may be relatively thin, for example between 2 microns and 10 microns, 10 microns to 20 microns, or greater than 20 microns. Preferably, the membrane comprising substrate 302 and epitaxial layer 304 with oxide layer 306 may be approximately 5 microns. The doping of the substrate 302 and epitaxial layer 304 may be relatively uniform throughout the thickness of the membrane.

Electrical contacts may be provided to the substrate 302 and substrate 304 to impose a voltage across the cavity (now a sealed gap) 312. Thus, the substrate 302 and/or substrate 308 may be serve as electrodes of the ultrasonic transducer.

The fabrication sequence of FIGS. 3A-3H is a non-limiting example of forming a CMUT having an oxide layer substantially free of dopants, while having an upper and lower substrate which are both doped. Alternative fabrication sequences are possible. For example, one or both of the lower oxide layer and upper oxide layer may be omitted.

For example, while the illustrated fabrication sequence involves forming an undoped epitaxial layer on substrate 302 followed by formation of an oxide layer, the same technique may be performed to form the lower substrate structure as well. That is, formation of the oxide layer 310 in FIG. 3F may optionally be preceded by formation of an undoped epitaxial layer on the substrate 308. An anneal may then be performed to diffuse dopants from substrate 308 into any overlying epitaxial silicon layer.

In practice, one of the substrate 302 or 308 may include circuitry. For example, substrate 308 may be a CMOS substrate (sometimes referred to herein simply as a "MOS" substrate) having integrated circuitry formed thereon. Thus, it may be preferable not to perform an anneal on that substrate, since high temperature processing may destroy any integrated circuitry on the substrate. Thus, according to one embodiment, the substrate 208 may include integrated circuitry, and an ultrasonic transducer may be formed according to the fabrication sequence of FIGS. 3A-3H.

As a further alternative to the fabrication sequence of FIGS. 3A-3H, while the substrate 308 is shown as undergoing the steps of forming an oxide on the substrate and etching a cavity into the oxide, as shown in FIGS. 3E-3G, it should be appreciated that these steps may be performed to form the upper substrate structure as well. That is, the oxide 306 may optionally be etched to form a cavity prior to bonding. Further alternatives are possible.

It should be appreciated from the foregoing that aspects of the present application provide a CMUT having an oxide layer defining an inner surface of the CMUT cavity. In some embodiments, two oxide layers define inner surfaces of the CMUT cavity. One or both of the oxide layers may be formed on an initially undoped epitaxial layer (e.g., undoped epitaxial silicon), and thus may be a high quality thermal oxide. The epitaxial layer may subsequently become doped through anneal of the structure.

According to another aspect of the present application, CMUTs having at least one layer of a patterned oxide may be constructed and employed. In some embodiments, it may be advantageous to have two oxide surfaces touching in collapse mode as opposed to a layer of oxide touching a layer of silicon. It may be further advantageous to restrict the amount surface area of contact by patterning one or both of the oxide layers. This may prevent the two oxide surfaces from inadvertently sticking to each other, referred to as stiction.

Figure 4A:
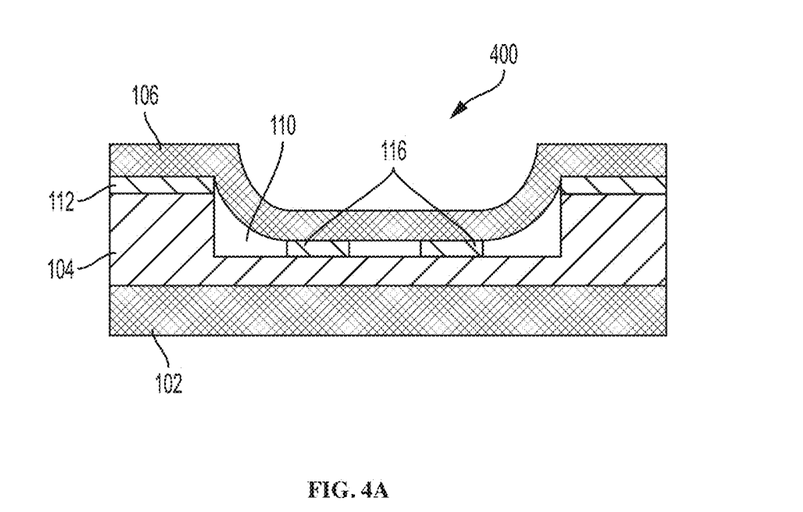
FIGS. 4A-4C illustrate non-limiting embodiments of micromachined ultrasonic transducers having patterned oxide layers.

FIG. 4A illustrates an ultrasonic transducer 400 according to a first embodiment in which the ultrasonic transducer 400 includes a patterned dielectric layer 112 as the upper dielectric layer. In this embodiment, the patterned surface of the patterned dielectric layer 112 forms two bumps or pillars 116. The bumps 116 contact the lower dielectric layer 104 when the ultrasonic transducer 400 operates in collapse mode. Although shown as two distinct bumps 116 in the cross-sectional view of FIG. 4A, it should be appreciated that in some embodiments the illustrated structure may have a ring or other closed contour configuration.

Figure 4B:
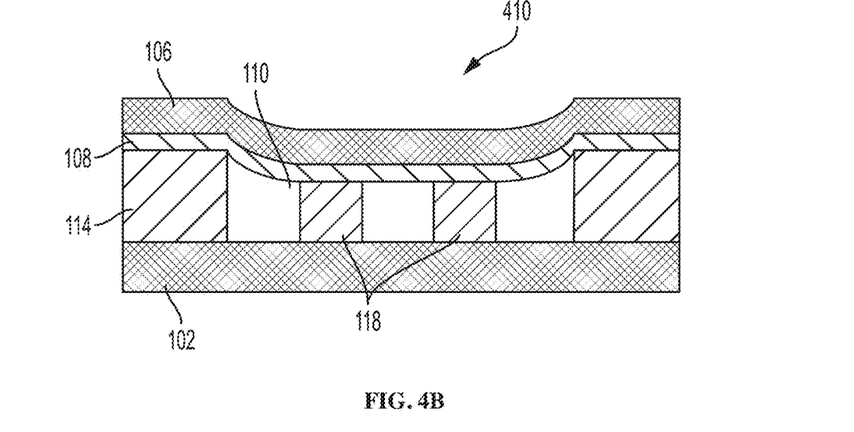

FIG. 4B illustrates an ultrasonic transducer 410 according to another embodiment in which the ultrasonic transducer 410 includes a patterned dielectric layer 114 as the lower dielectric layer. In this embodiment, the patterned surface of the patterned dielectric layer 114 forms two bumps or pillars 118. The upper dielectric layer 108 contacts the bumps 118 when the ultrasonic transducer 410 operates in collapse mode. As with the bumps 116, the bumps 118 may in some embodiments represent a cross-sectional view of a ring or other closed contour.

Figure 4C:
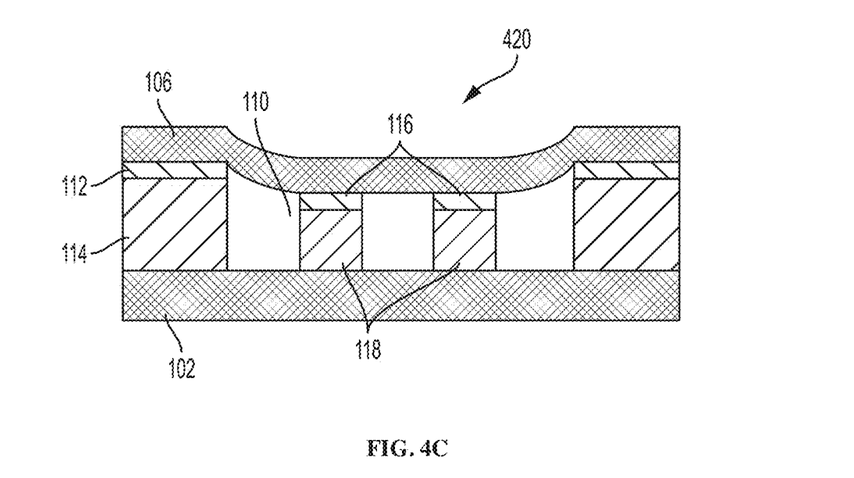

FIG. 4C illustrates an ultrasonic transducer 420 according to another embodiment in which the CMUT includes both a patterned dielectric layer 112 as the upper dielectric layer and a patterned dielectric layer 114 as the lower dielectric layer. In this embodiment, the patterned surface of the patterned dielectric layer 112 forms two bumps or pillars 116 and the patterned surface of the patterned dielectric layer forms two bumps or pillars 118. The bumps 116 may contact the bumps 118 when the ultrasonic transducer 420 operates in collapse mode.

While two bumps are shown on the patterned dielectric surfaces illustrated in FIGS. 4A-4C, other structures are possible. The bumps on a patterned dielectric surface may form a ring, or there may be a single bump, or there may be multiple discrete bumps of any suitable shape and placement.

Thus, it should be appreciated that according to aspects of the present application a CMUT is provided having facing oxide layers wherein at least one of the oxide layers is patterned. When the CMUT is operated in collapse mode, the facing oxide layers may come into contact.

According to another aspect of the present application, CMUTs of various doping configurations may be constructed and employed. As described previously in connection with FIGS. 3A-3H, a CMUT may have multiple doped substrates, such as substrates 302 and 308. The doping types used may form different electrical devices, which may be used to provide beneficial operation. For example, the doping configuration of the CMUT may be selected to inhibit or prevent entirely leakage current and/or charge build-up in the separating insulating (e.g., oxide) layer(s), even during collapse mode operation. FIGS. 5A-5D illustrate various doping configurations of an ultrasonic transducer, according to various embodiments of the present application. The configurations described in FIGS. 5A-5D may employ at least one patterned dielectric layer as described in connection with FIGS. 4A-4C.

For simplicity of explanation, the CMUT structure of FIG. 1 is again used to described various alternative doping configurations. In one embodiment, the substrate 102 may have P-type doping and the membrane 106 may have N-type doping. In another embodiment, the substrate 102 and the membrane 106 may both have P-type doping. In another embodiment, the substrate 102 and the membrane 106 may both have N-type doping. In another embodiment, the substrate 102 may have N-type doping and the membrane 106 may have P-type doping. These configurations are illustrated in FIGS. 5A-5D.

Figure 5A:
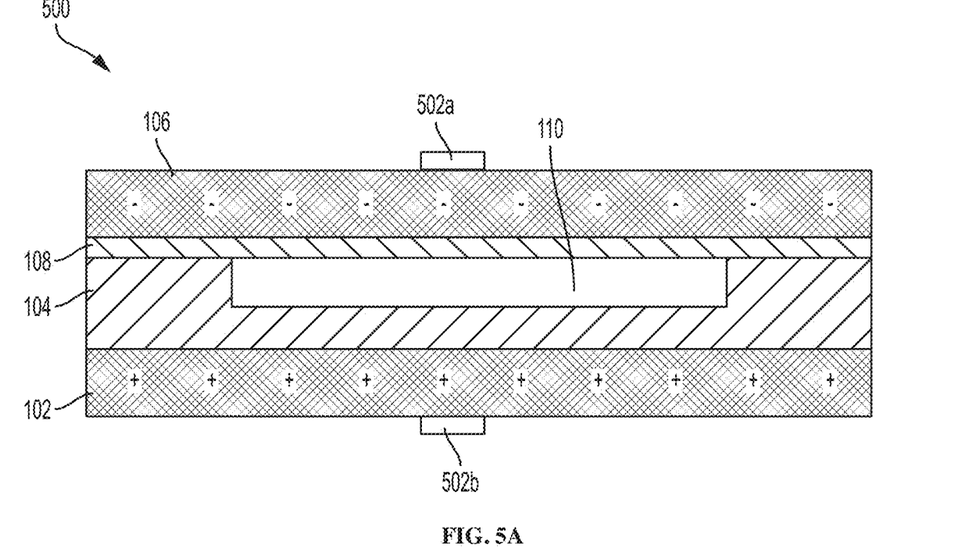
FIGS. 5A-5D illustrate various doping configurations of an ultrasonic transducer, according to various embodiments of the present application.

FIG. 5A illustrates an ultrasonic transducer 500 according to a first embodiment, in which the substrate 102 has P-type doping (denoted by "+" symbols) and the membrane 106 has N-type doping (denoted by "−" symbols). The dielectric layers 104 and 106 may be an I-type, and thus the configuration of the first embodiment may form a P-I-N structure. Electrodes 502a and 502b may be included to contact the membrane 106 and substrate 102, respectively, although alternative electrical contact structures may be employed.

Figure 5B:
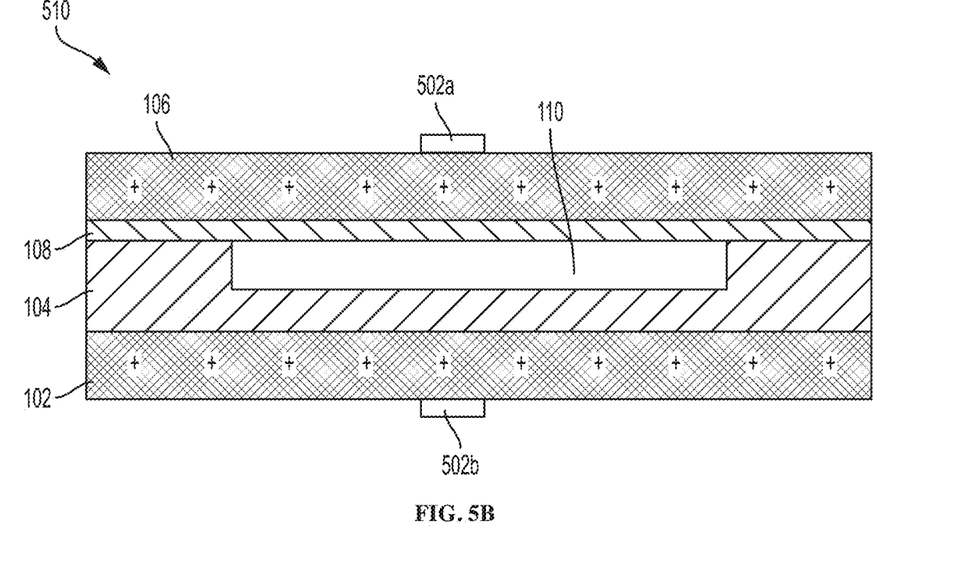

FIG. 5B illustrates an ultrasonic transducer 510 according to another embodiment, in which both the substrate 102 and the membrane 106 have P-type doping (denoted by "+" symbols). The dielectric layers 104 and 106 may be an I-type, and thus the configuration of the second embodiment may form a P-I-P structure. Electrodes 502a and 502b may be included to contact the membrane 106 and substrate 102, respectively, although alternative electrical contact structures may be employed.

Figure 5C:
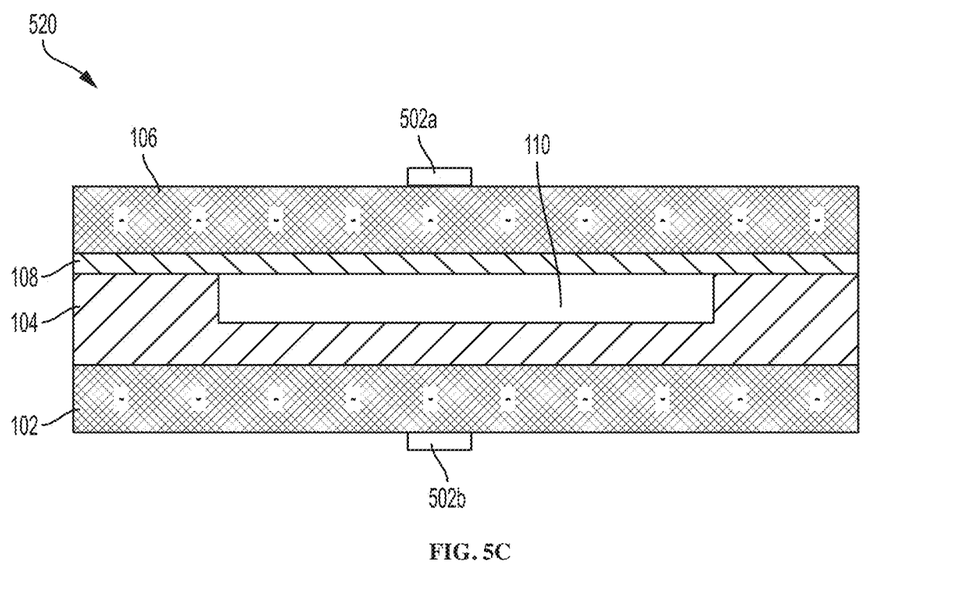

FIG. 5C illustrates an ultrasonic transducer 520 according to another embodiment, in which both the substrate 102 and the membrane 106 have N-type doping (denoted by "−" symbols). The dielectric layers 104 and 106 may be an I-type, and thus the configuration of the third embodiment may form an N-I-N structure. Electrodes 502a and 502b may be included to contact the membrane 106 and substrate 102, respectively, although alternative electrical contact structures may be employed.

Figure 5D:
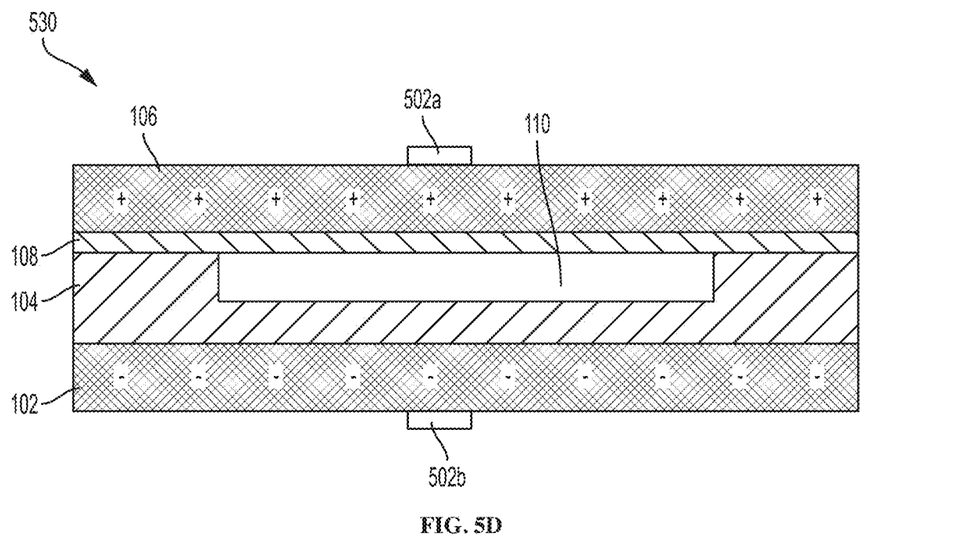

FIG. 5D illustrates an ultrasonic transducers 530 according to another embodiment, in which the substrate 102 has N-type doping (denoted by "−" symbols) and the membrane 106 has P-type doping (denoted by "+" symbols). The dielectric layers 104 and 106 may be an I-type, and thus the configuration of the fourth embodiment may form an N-I-P structure. Electrodes 502a and 502b may be included to contact the membrane 106 and substrate 102, respectively, although alternative electrical contact structures may be employed.

Thus, various doping configurations may be used to form various types of CMUTs. The CMUT selected may depend on anticipated operating conditions, such as anticipated operating voltages and/or whether the CMUT is expected to operate in collapse mode.

In some aspects of the present application, a capacitive micromachined ultrasonic transducer (CMUT) is provided, the CMUT comprising: a first silicon layer; an epitaxial silicon layer disposed on the first silicon layer; a second silicon layer separated from the epitaxial layer by a cavity; and a dielectric layer disposed between the epitaxial layer and the second silicon layer.

In some embodiments, the first silicon layer and epitaxial silicon layer are doped, and the dielectric layer has a lower doping concentration than the first silicon layer.

In some embodiments, the dielectric layer is silicon oxide.

In some embodiments, the cavity is disposed in the dielectric layer.

In some embodiments, the CMUT further comprises an oxide layer disposed between the second silicon layer and the dielectric layer, wherein the cavity is disposed in the oxide layer.

In some embodiments, when the CMUT is operating in a first mode, the dielectric layer is configured to not make contact with a bottom boundary of the cavity.

In some embodiments, when the CMUT is operating in a collapse mode, the dielectric layer is configured to make contact with a bottom boundary of the cavity.

In some embodiments, the dielectric layer is etched to include at least one bump and, when the CMUT is operating in the collapse mode, the dielectric layer is configured to make contact with the bottom boundary of the cavity.

In some embodiments, when the CMUT is operating in a collapse mode, the dielectric layer is configured to make contact with a bottom boundary of the cavity disposed in the oxide layer.

In some embodiments, the oxide layer is etched to include at least one bump and, when the CMUT is operating in the collapse mode, the dielectric layer is configured to make contact with the at least one bump of the oxide layer.

In some embodiments, the dielectric layer is etched to include at least one bump and, when the CMUT is operating in the collapse mode, the at least one bump of the dielectric layer is configured to make contact with the at least one bump of the oxide layer.

In another aspect of the present application, a method of forming a capacitive micromachined ultrasonic transducer (CMUT) is provided, the method comprising: forming a first substrate by: depositing a layer of epitaxial silicon on a doped silicon layer; forming a layer of silicon dioxide on the layer of epitaxial silicon; and diffusing dopants from the doped silicon layer into the layer of epitaxial silicon by performing an anneal; and bonding the first substrate with a second substrate such that the silicon dioxide contacts the second substrate.

In some embodiments, the second substrate comprises an oxidized layer of silicon, and bonding the first substrate with the second substrate comprises forming an oxide-oxide bond.

In some embodiments, bonding the first substrate with the second substrate comprises bonding a silicon layer to the layer of silicon dioxide.

In some embodiments, the method further comprises forming a cavity in the doped layer of silicon dioxide prior to bonding the first substrate with the second substrate.

In some embodiments, the second substrate comprises a second doped silicon layer and a layer of silicon dioxide on the second doped silicon layer, and bonding the first substrate with the second substrate comprises forming a cavity in the layer of silicon dioxide on the second doped silicon layer and bonding the layer of silicon dioxide on the layer of epitaxial silicon to the layer of silicon dioxide on the second doped silicon layer.

In some embodiments, the method further comprises etching at least one bump in the layer of silicon dioxide on the layer of epitaxial silicon.

In some embodiments, the method further comprises etching at least one bump in the layer of silicon dioxide on the second doped silicon layer.

In some embodiments, the method further comprises etching at least one bump in both the layer of silicon dioxide on the layer of epitaxial silicon and the layer of silicon dioxide on the second doped silicon layer.

In some embodiments, etching the at least one bump in the layer of silicon dioxide on the layer of epitaxial silicon comprises positioning the at least one bump such that it is disposed within the cavity after bonding the first substrate with the second substrate In another aspect of the present application, a capacitive micromachined ultrasonic transducer (CMUT) is provided, the CMUT comprising: a substrate, membrane, and dielectric layer disposed between the substrate and membrane, wherein the substrate and membrane are disposed with a cavity between them, and wherein one of the substrate and membrane is doped N-type and the other of the substrate and membrane is doped P-type.

In some embodiments, the membrane is doped N-type and the substrate is doped P-type.

In some embodiments, the membrane is doped P-type and the substrate is doped N-type.

In some embodiments, the dielectric is I-type, such that the substrate, membrane, and dielectric form a P-I-N structure or N-I-P structure.

In some embodiments, the CMUT further comprises a first electrode contacting the membrane and a second electrode contacting the substrate, wherein the first and second electrodes are separated by the cavity.

In some embodiments, the membrane comprises a bulk silicon layer and an epitaxial silicon layer on the bulk silicon layer, the epitaxial silicon layer being disposed between the bulk silicon layer and the dielectric layer.

In some embodiments, the substrate and membrane are both formed of silicon and the dielectric is formed of silicon dioxide.

In some embodiments, the dielectric layer is a first dielectric layer and is disposed on the membrane, and the CMUT further comprises a second dielectric layer disposed on the substrate between the substrate and the first dielectric layer.

In some embodiments, the dielectric layer comprises a trench representing the cavity.

In some embodiments, the membrane has a thickness of between 4-50 microns and is doped throughout the thickness.

In another aspect of the present application, a capacitive micromachined ultrasonic transducer (CMUT) is provided, the CMUT comprising: a first doped semiconductor layer; a first electrode on the first doped semiconductor layer; a second doped semiconductor layer, wherein the first and second doped semiconductor layers are disposed with a cavity between them such that the first doped semiconductor layer forms a membrane over the cavity; a second electrode on the second doped semiconductor layer; and an oxide layer between the first and second doped semiconductor layers.

In some embodiments, the oxide layer has a lower doping concentration than the first doped semiconductor layer and the second doped semiconductor layer.

In some embodiments, the first doped semiconductor layer and second doped semiconductor layer are doped N-type and P-type, respectively.

In some embodiments, the first doped semiconductor layer and second doped semiconductor layer are doped P-type and N-type, respectively.

In some embodiments, the oxide layer comprises a trench.

In another aspect of the present application, a capacitive micromachined ultrasonic transducer (CMUT) is provided, the CMUT comprising: a substrate, a membrane, and a first and second dielectric layer disposed between the substrate and membrane, wherein: the first dielectric layer is located on an underside of the membrane; the second dielectric layer is located on the substrate opposed the first dielectric layer; the substrate and membrane are further disposed with a cavity between them; at least one of the first and second dielectric layers is a patterned layer with a non-uniform surface; and wherein one of the substrate and membrane is doped N-type and the other of the substrate and membrane is doped P-type.

In some embodiments, both the first and second dielectric layers are patterned.

In some embodiments, only the first dielectric layer is patterned. In some embodiments, only the second dielectric layer is patterned.

In some embodiments, the patterned layer(s) is a dielectric layer.

In some embodiments, the dielectric layer of the first and second dielectric layers that is not patterned is a dielectric layer.

In some embodiments, the membrane is doped N-type and the substrate is doped P-type.

In some embodiments, the membrane is doped P-type and the substrate is doped N-type.

In some embodiments, the first and second dielectric layers are I-type, such that the substrate, membrane, and the dielectric layers form a P-I-N structure or N-I-P structure.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A capacitive micromachined ultrasonic transducer (CMUT), comprising:
   a membrane configured to vibrate, the membrane comprising:
      a doped substrate; and
      an epitaxial silicon layer disposed on the doped substrate;
   a substrate separated from the epitaxial silicon layer by a cavity, and wherein the epitaxial silicon layer is disposed between the doped substrate of the membrane and the substrate; and
   a dielectric layer disposed between the epitaxial silicon layer and the substrate, wherein the dielectric layer is etched to include at least one bump, and
   wherein, when the CMUT is operating in a collapse mode, the dielectric layer is configured to make contact with a bottom boundary of the cavity.

2. The CMUT of claim 1, wherein the epitaxial silicon layer is doped, and wherein the dielectric layer has a lower doping concentration than the doped substrate.

3. The CMUT of claim 2, wherein the dielectric layer is silicon oxide.

4. The CMUT of claim 3, wherein, when the CMUT is operating in a first mode, the dielectric layer is configured to not make contact with the bottom boundary of the cavity.

5. The CMUT of claim 4, wherein, when the CMUT is operating in the first mode, the dielectric layer is configured to flex with the membrane.

6. A capacitive micromachined ultrasonic transducer (CMUT), comprising:
   a membrane configured to vibrate, the membrane comprising:
      a doped substrate; and
      an epitaxial silicon layer disposed on the doped substrate;
   a substrate separated from the epitaxial silicon layer by a cavity, and wherein the epitaxial silicon layer is disposed between the doped substrate of the membrane and the substrate;
   a dielectric layer disposed between the epitaxial silicon layer and the substrate; and
   an oxide layer disposed between the substrate and the dielectric layer, wherein the oxide layer is etched to include at least one bump,
   wherein the cavity is disposed in the oxide layer,
   wherein, when the CMUT is operating in a collapse mode, the dielectric layer is configured to make contact with a bottom boundary of the cavity disposed in the oxide layer, and, when the CMUT is operating in the collapse mode, the dielectric layer is configured to make contact with the at least one bump of the oxide layer.

7. The CMUT of claim 6, wherein the dielectric layer is etched to include at least one bump and, when the CMUT is operating in the collapse mode, the at least one bump of the dielectric layer is configured to make contact with the at least one bump of the oxide layer.

* * * * *

UNITED STATES PATENT AND TRADEMARK OFFICE
CERTIFICATE OF CORRECTION

| | |
|---|---|
| PATENT NO. | : 10,850,306 B2 |
| APPLICATION NO. | : 15/905289 |
| DATED | : December 1, 2020 |
| INVENTOR(S) | : Jonathan M. Rothberg et al. |

It is certified that error appears in the above-identified patent and that said Letters Patent is hereby corrected as shown below:

In the Claims

Claim 3, at Column 14, Line 4, "claim 2" should read --claim 1--.
Claim 4, at Column 14, Line 6, "claim 3" should read --claim 1--.

Signed and Sealed this
Thirteenth Day of September, 2022

Katherine Kelly Vidal
*Director of the United States Patent and Trademark Office*